United States Patent
Chauhan et al.

(10) Patent No.: US 7,925,369 B2
(45) Date of Patent: Apr. 12, 2011

(54) METHOD AND APPARATUS FOR OPTIMIZING MODELS FOR EXTRACTING DOSE AND FOCUS FROM CRITICAL DIMENSION

(75) Inventors: Siddharth Chauhan, Austin, TX (US); Kevin R. Lensing, Austin, TX (US); James Broc Stirton, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 697 days.

(21) Appl. No.: 11/958,448

(22) Filed: Dec. 18, 2007

(65) Prior Publication Data

US 2009/0157577 A1    Jun. 18, 2009

(51) Int. Cl.
*G06F 19/00* (2006.01)
*G06F 15/18* (2006.01)
(52) U.S. Cl. ............... 700/121; 700/30; 700/31; 700/47
(58) Field of Classification Search ............. 700/29–31, 700/47, 121; 703/2; 355/53, 55; 706/16
See application file for complete search history.

(56) References Cited

U.S. PATENT DOCUMENTS

| | | | |
|---|---|---|---|
| 7,042,551 B2 | 5/2006 | Ausschnitt | 355/55 |
| 7,653,890 B2 * | 1/2010 | Tsai et al. | 716/11 |
| 2005/0222781 A1 * | 10/2005 | Yue et al. | 702/30 |

OTHER PUBLICATIONS

Ina et al. "Focus and Dose Controls, and their application in Lithography" Proc. of SPIE vol. 6518, pp. 651807-1 to 651807-8, Apr. 2007.*
Lensing et al. "Lithography Process Control using Scatterometry Metrology and Semi-Physical Modeling" Proc. of SPIE vol. 6518, pp. 651804-1 to 651804-12, Apr. 4, 2007.*
Mack et al. "Improved Model for Focus-Exposure Data Analysis" Proc. SPIE vol. 5038, pp. 396-405, 2003.*
Zhou et al. "Advanced Exposure and Focus Control by Proximity Profile Signature Matching" Proc. SPIE vol. 6155, pp. 61550H-1 to 61550H-11, 2006.*
"Modeling for Profile-Based Process-Window Metrology", by Ausschnitt, et al, Feb. 26, 2005, p. 1-10.

* cited by examiner

*Primary Examiner* — Albert Decady
*Assistant Examiner* — Steven R Garland
(74) *Attorney, Agent, or Firm* — Williams, Morgan & Amerson, P.C.

(57) ABSTRACT

A method includes defining a reference model of a system having a plurality of terms for modeling data associated with the system. A reference fit error metric is generated for the reference model. A set of evaluation models each having one term different than the reference model is generated. An evaluation fit error metric for each of the evaluation models is generated. The reference model is replaced with a selected evaluation model responsive to the selected evaluation model having an evaluation fit error metric less than the reference fit error metric. The model evaluation is repeated until no evaluation model has an evaluation fit error metric less than the reference fit error metric. The reference model is trained using the data associated with the system, and the trained reference model is employed to determine at least one characteristic of the system.

23 Claims, 3 Drawing Sheets

METHOD AND APPARATUS FOR OPTIMIZING MODELS FOR EXTRACTING DOSE AND FOCUS FROM CRITICAL DIMENSION

CROSS-REFERENCE TO RELATED APPLICATIONS

Not applicable.

BACKGROUND OF THE INVENTION

The disclosed subject matter relates generally to integrated circuit manufacturing and, more particularly, to a method and apparatus for optimizing models for extracting dose and focus from critical dimension data.

The formation of various integrated circuit (IC) structures on a wafer often relies on lithographic processes, sometimes referred to as photolithography, or simply lithography. As is well known, lithographic processes can be used to transfer a pattern of a photomask (also referred to herein as a mask or a reticle) to a wafer.

For instance, patterns can be formed from a photoresist layer disposed on the wafer by passing light energy through a mask having an arrangement to image the desired pattern onto the photoresist layer. As a result, the pattern is transferred to the photoresist layer. In areas where the photoresist is sufficiently exposed, and after a development cycle, the photoresist material becomes soluble such that it can be removed to selectively expose an underlying layer (e.g., a semiconductor layer, a metal or metal containing layer, a dielectric layer, a hard mask layer, etc.). Portions of the photoresist layer not exposed to a threshold amount of light energy will not be removed and serve to protect the underlying layer during further processing of the wafer (e.g., etching exposed portions of the underlying layer, implanting ions into the wafer, etc.). Thereafter, the remaining portions of the photoresist layer can be removed.

There is a pervasive trend in the art of IC fabrication to increase the density with which various structures are arranged. For example, feature size, line width, and the separation between features and lines are becoming increasingly smaller. In these sub-micron processes, yield is affected by factors such as mask pattern fidelity, optical proximity effects and photoresist processing. Some of the more prevalent concerns include line end pullback, corner rounding and line-width variations. These concerns are largely dependent on local pattern density and topology.

As semiconductor device technology migrates to the 45-nm node and beyond, process capability for critical lithography steps are becoming increasingly difficult to maintain. The resolution of the photolithography process determines the smallest feature size that can be repeatedly produced on a wafer:

$$R = \frac{k_1 \lambda}{NA},$$

where $\lambda$ is the wavelength and NA is the numerical aperture.

Depth of focus (DOF) is the distance a wafer can depart from best focus before the image quality is lost.

$$DOF = \frac{k_2 \lambda}{2(NA)^2}.$$

Hence, by increasing the NA and reducing $\lambda$, resolution is improved, but depth of focus is reduced.

At previous technology nodes, the depth-of-focus (DOF) for critical patterning layers was large enough to assume that focus variation would not have a significant impact on output quality metrics. As this assumption becomes less realistic, new methodologies are needed to control focus. On the equipment side, traditional techniques for periodic calibration of machine focus are proving incapable of addressing subtle variations that occur on products at small geometries. On product, run-to-run APC control of critical dimensions (CD) using exposure dose alone relies on the underlying assumption that focus deviations will not significantly impact the approximately linear relationship between dose and CD.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF THE INVENTION

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes defining a reference model of a system for modeling data associated with the system. The reference model has a plurality of terms. A reference fit error metric is generated for the reference model. A set of evaluation models each having one term different than the reference model is generated. An evaluation fit error metric for each of the evaluation models is generated. The reference model is replaced with a selected evaluation model responsive to the selected evaluation model having an evaluation fit error metric less than the reference fit error metric. The generating of the reference fit error metric, the generating of the set of evaluation models, the generating of the evaluation fit error metrics, and the replacing of the reference are repeated based on the replaced reference model until no evaluation model has an evaluation fit error metric less than the reference fit error metric. The reference model is trained using the data associated with the system, and the trained reference model is employed to determine at least one characteristic of the system.

Another aspect of the disclosed subject matter is seen in a method for monitoring a photolithography system. A reference model of the photolithography system is defined for modeling top and bottom critical dimension data associated with features formed by the photolithography system as a function of dose and focus, the reference model having a plurality of terms. A reference fit error metric is generated for the reference model. A set of evaluation models each having one term different than the reference model is generated. An evaluation fit error metric is generated for each of the evaluation models. The reference model is replaced with a selected evaluation model responsive to the selected evaluation model having an evaluation fit error metric less than the reference fit error metric. The generating of the reference fit error metric, the generating of the set of evaluation models, the generating of the evaluation fit error metrics, and the replacing of the reference model are repeated based on the replaced reference model until no evaluation model has an evaluation fit error metric less than the reference fit error metric. The reference model is trained using the top and bottom critical dimension data. A top critical dimension measurement and a bottom critical dimension measurement of a feature formed by the photolithography system using a commanded dose parameter and a commanded focus parameter are received. The trained reference model is employed using the top and bottom critical dimension measurements to determine values for a received dose parameter and a received focus parameter. The received dose and focus parameters are compared to the commanded dose and focus parameters to characterize the photolithography system.

BRIEF DESCRIPTION OF THE SEVERAL VIEWS OF THE DRAWINGS

The disclosed subject matter will hereafter be described with reference to the accompanying drawings, wherein like reference numerals denote like elements, and.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION OF THE INVENTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1:
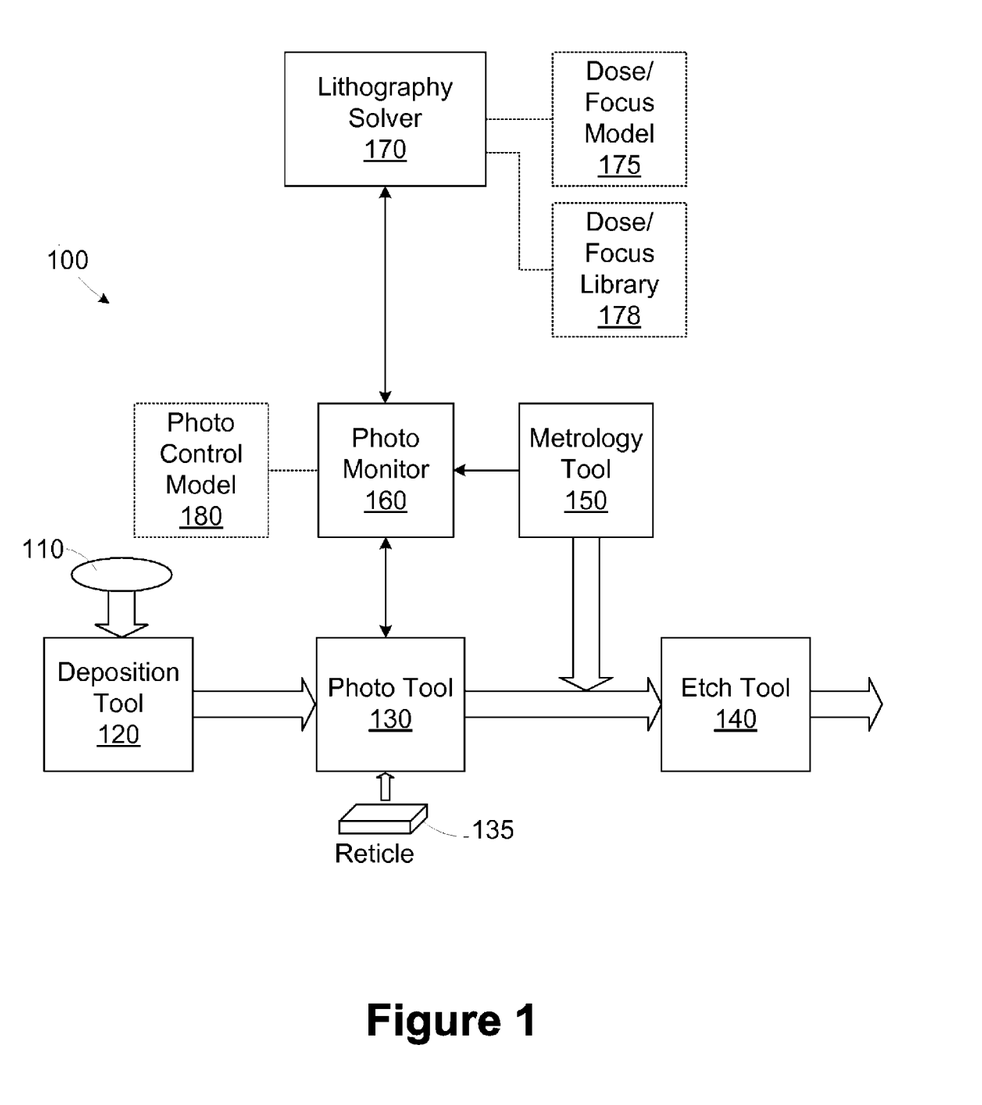
FIG. 1 is a simplified block diagram of a manufacturing system in accordance with one illustrative embodiment.

Referring now to the drawings wherein like reference numbers correspond to similar components throughout the several views and, specifically, referring to FIG. 1, the present invention shall be described in the context of an illustrative manufacturing system 100 for processing wafers 110 in accordance with one illustrative embodiment of the present invention is provided. In the illustrated embodiment, the manufacturing system 100 includes a deposition tool 120 for forming one or more process layers on the wafer 110, a photolithography tool 130 for patterning the layers using a reticle 135, an etch tool 140 for etching various features in the various process layers, a metrology tool 150 for measuring features on the wafer 110, a photolithography monitor 160, and a photolithography solver 170. The photolithography solver 170 employs a dose/focus model 175 to generate a dose/focus library 178 that may be used to extract dose and focus information for the photolithography monitor 160, as will be described in greater detail below.

In the illustrated embodiment, the photolithography monitor 160 and the photolithography solver 170 are implemented using computers programmed with software to implement the functions described. However, as will be appreciated by those of ordinary skill in the art, a hardware controller designed to implement the particular functions may also be used. Moreover, the functions performed by the photolithography monitor 160 and photolithography solver 170, as described herein, may be performed by a combined entity or by multiple devices distributed throughout a system.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

The deposition tool 120 may be used to form process layers for a semiconductor device, such as polysilicon layers, dielectric layers, metal layers, etc. The photolithography tool 130 employs the reticle 135 and a light source (not shown) for exposing layers of photoresist as part of the process of generating a mask for subsequent etching of the process layers. The etch tool 140 may be employed to form features of the semiconductor device from the process layers. For ease of illustration and to avoid obscuring the present invention, only a portion of the manufacturing system 100 is illustrated. An actual implementation of the manufacturing system 100 may have additional types of tools and multiples instances of each tool type. The tools 120, 130, 140 may comprise cluster tools with multiple chambers or components.

Various tools may be used as the metrology tool 150 to collect the dimension data. In the illustrated embodiment an optical metrology tool, such as a scatterometry tool is employed to collect metrology data related to resist features formed by the photolithography tool 130, however, other types of tools may be used. The metrology tool 150 may perform destructive or non-destructive tests, depending on the desired quantity and/or accuracy of the metrology data.

In general, the photolithography monitor 160 evaluates measured top and bottom critical dimension (CD) data of the resist patterns formed by the photolithography tool 130 and uses a dose/focus library 178 to extract dose and focus information for observing the operating state of the photolithography tool 130.

Generally, it is not possible to determine a unique value for dose and focus based on a single CD measurement. There is a physical focus offset between the top and bottom of a line that results in different behavior of top and bottom CD under dose and focus variation. This situation leads to a system of two equations in two unknowns that may be solved for unique dose and focus values. This photolithography system can be expressed as $$CD_{top} = \sum_{i=0}^{M} \sum_{j=0}^{N} a_{ij} \frac{F^j}{E^i} \text{ and } CD_{bottom} = \sum_{i=0}^{M} \sum_{j=0}^{N} b_{ij} \frac{F^j}{E^i}, \quad (1)$$

where $a_{i,j}$ and $b_{i,j}$ are the model coefficients, $F^j$ is the focus term raised to the $j^{th}$ power, $E^i$ is the exposure term raised to the $i^{th}$ power, M is the maximum order of the exposure terms, and N is the maximum order of the focus terms. These equations for modeling top and bottom CD represent the dose/focus model 175. The selection of M and N define the allowed complexity of the dose/focus model 175.

An issue arising with modeling is that experimental data contains an unknown amount of noise that should not be incorporated into the model. By definition, as model complexity increases, the mean squared error (MSE), or any other criterion for measuring fit to experimental data, will improve. However, at some level of model complexity, additional descriptor parameters begin to incorporate experimental noise into the model. It is often difficult, especially with small experimental data sets, to determine the appropriate level of model complexity to capture all of the real process dynamics without fitting to noise.

In the illustrated embodiment, the complexity of the dose/focus model 175 is limited to a maximum exposure order of 3 (i.e., M) and a maximum focus order of 4 (i.e., N), resulting in a total of 20 potential model parameters. Hence, the total number of possible models is 220. The photolithography solver 170 attempts to optimize the dose/focus model 175 using measured top and bottom CD values to provide sufficient complexity to accurately model the test data, without modeling noise in the test data. This is done through cross-validation techniques. Cross-validation techniques involve training a model with a subset of the experimental data, then using the remaining data to "test" the model error. Unlike traditional fit metrics, at some point additional model complexity causes the cross-validation test error to increase. The increase in test error is an indication that the additional model complexity is actually fitting to experimental noise, and the model complexity should be terminated at that point.

The simplest type of cross-validation to determine model efficacy is called the test-set method. In this method, 70% of the data is used to train a model, and the remaining 30% is used to test the model. K-fold cross-validation is a more robust technique, whereby the dataset is broken into "k" partitions. First, k-1 partitions are used to train the data, then the final partition is used to test the model. This process is repeated k times and the mean test error is reported as the indicator of model quality. Finally, there is leave-one-out cross validation (LOOCV), which is simply an exemplary case of k-fold validation where k equals the total number of experimental data points.

Generally, focus-exposure matrix (FEM) data gathered for a photolithography process contains a relatively small number of points. Furthermore, there is usually only one data point for each discrete combination of dose and focus. For these reasons, it is useful to train the dose/focus model 175 with the maximum amount of data, which suggests the use of LOOCV. The general LOOCV technique generates an error statistic for a given dose/focus model 175 LOOCV by using all but one data point to train the model, then calculating the fit error of the single remaining point. Numerical techniques for training the model to determine the model coefficients are known to those of ordinary skill in the art, so they are not described in greater detail herein. The technique includes a plurality of iterations, where a different data point is excluded for each iteration. The mean fit error is determined across the total number of iterations. The mean fit error provides a relative metric indicating the efficacy of the model. The mean fit error for two models may be compared to determine which model more effectively models the test data. The general LOOCV procedure is by the following steps, where R is the total number of data points in the data set:

For k=1 to R
  1. Let $(x_k, y_k)$ be the kth record
  2. Temporarily remove $(x_k, y_k)$ from the dataset
  3. Train on the remaining R-1 data points
  4. Note the error $(x_k, y_k)$
  5. After R runs, report the mean fit error of test sets.

In some embodiments, the photolithography solver 170 may use a global LOOCV approach that evaluates all possible dose/focus models 175. The global LOOCV optimization scheme searches globally for optimized top and bottom CD models by testing every possible model using LOOCV. The dose/focus model 175 with the minimum mean test set error is selected as optimized model. In the example where the maximum exposure order is 3, and the maximum focus order is 4, a total of 20 potential model parameters is available. Thus, the total number of possible models is $2^{20}$. If certain parameters are forced to be included or excluded during the global search, the runtime can be significantly reduced. Forced inclusion and/or exclusion of n parameters reduces the runtime by approximately $2^n$. In the illustrated embodiment, the photolithography solver 170 includes the constant term $a_{00}$ in all models. Although a global LOOCV search guarantees the identification of the highest performing model, the amount of processing resources consumed is significant, leading to a long run time.

To reduce run time, in some embodiments, the photolithography solver 170 employs a stepwise LOOCV technique that significantly reduces the number of dose/focus models 175 that need to be evaluated to optimize the model. This optimization scheme is based on a stepwise search for optimized top and bottom CD models starting with a set of user-optimized model parameters. Generally, the stepwise LOOCV technique compares models 175 that are one term different than the starting reference model (i.e., by adding or subtracting a single term). Hence, for every model comparison steps, LOOCV is performed for only 20 dose/focus models 175. If a better performing model 175 is identified, it becomes the reference model for a subsequent iteration. The process terminates when no other model 175 that differs by one term performs better than the reference model based on the mean fit error statistic. In the case where the constant term is forced to be included in all models, the number of models 175 evaluated for each step in the stepwise LOOCV technique is reduced to 19.

Figure 2:
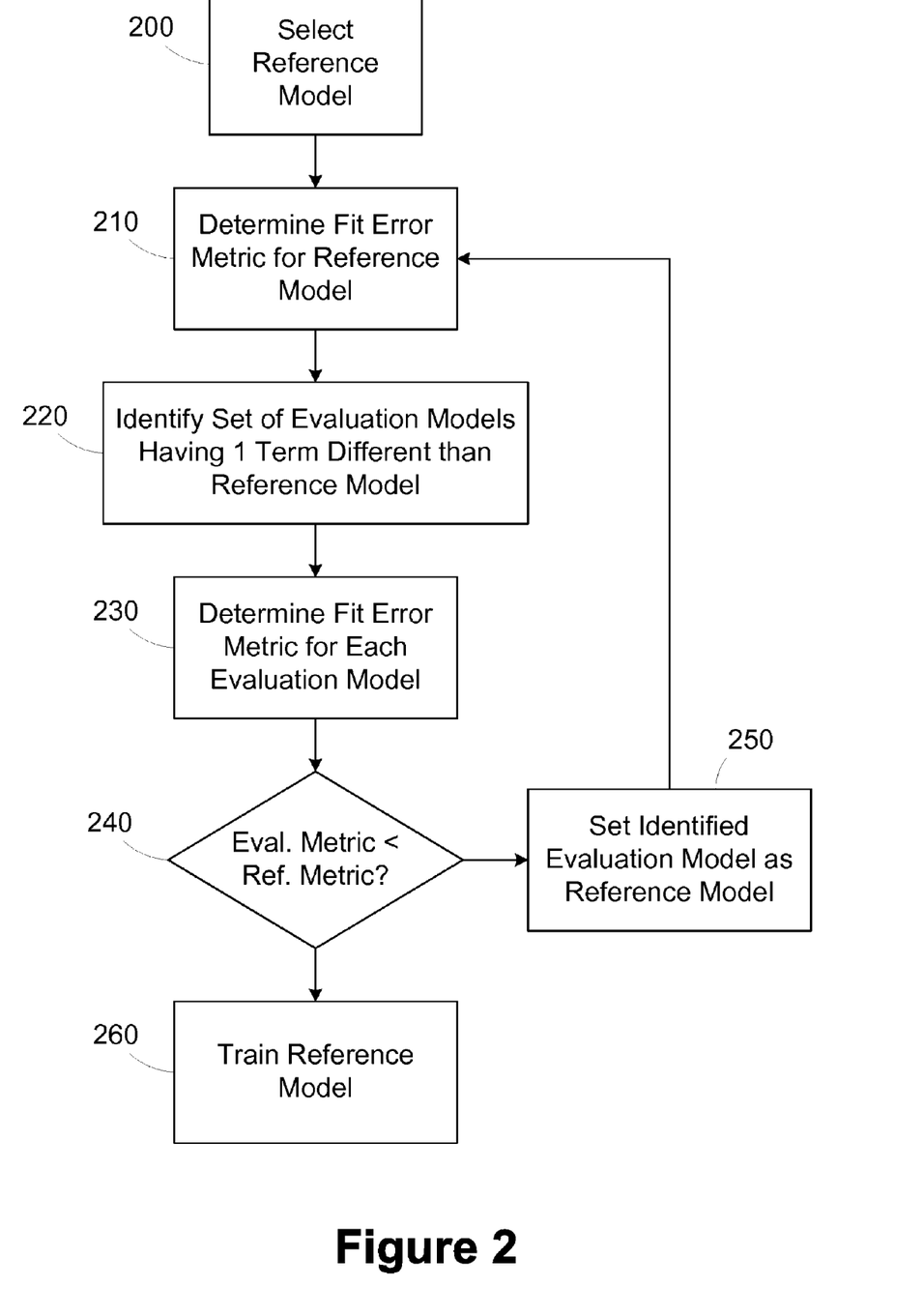
FIG. 2 is a simplified flow diagram of a method for optimizing a model in accordance with another illustrative embodiment.

FIG. 2 is a simplified flow diagram illustrating the stepwise LOOCV optimization technique. In method block 200, a reference model is selected. The initial model for the photolithography process is determined based on engineering input. An engineer may use experience or some level of experimentation to determine the initial model complexity. Over time, the engineers may determine baseline complexity data for different products, tools, or processes that provide guidance as to the initial model complexity selected. An exemplary 10-term reference model is:

$$CD^R = a_{00} + a_{01}F + a_{02}F^2 + a_{03}F^3 + a_{04}F^4 + a_{10}\frac{1}{E} + a_{11}\frac{F}{E} + a_{12}\frac{F^2}{E} + a_{13}\frac{F^3}{E} + a_{14}\frac{F^4}{E}$$

The notation may be simplified for the reference model by combining each term of the model and the associated coefficient as:

$$CD^R = T_{00} + T_{01} + T_{02} + T_{03} + T_{04} + T_{10} + T_{11} + T_{12} + T_{13} + T_{14},$$
$$T_{ij} = a_{ij}F^j E^{-i}$$

In method block 210, a fit error metric for the reference model is determined. In the illustrated embodiment, the fit error metric, $FE_R$, is determined as the mean fit error for the set of LOOCV iterations. In method block 220, a set of evaluation models having one term different than the reference model is generated. For example, as compared to the 10-term reference model, the set of evaluation models would include:

$$CD^{E1} = T_{00} + T_{01} + T_{02} + T_{03} + T_{04} + T_{10} + T_{11} + T_{12} + T_{13}$$

$$CD^{E2} = T_{00} + T_{01} + T_{02} + T_{03} + T_{04} + T_{10} + T_{11} + T_{12} + T_{14}$$

$$CD^{E3} = T_{00} + T_{01} + T_{02} + T_{03} + T_{04} + T_{10} + T_{11} + T_{13} + T_{14}$$

$$CD^{E4} = T_{00} + T_{01} + T_{02} + T_{03} + T_{04} + T_{10} + T_{12} + T_{13} + T_{14}$$

$$CD^{E5} = T_{00} + T_{01} + T_{02} + T_{03} + T_{04} + T_{11} + T_{12} + T_{13} + T_{14}$$

$$CD^{E6} = T_{00} + T_{01} + T_{02} + T_{03} + T_{10} + T_{11} + T_{12} + T_{13} + T_{14}$$

$$CD^{E7} = T_{00} + T_{01} + T_{03} + T_{04} + T_{10} + T_{11} + T_{12} + T_{13} + T_{14}$$

$$CD^{E8} = T_{00} + T_{01} + T_{03} + T_{04} + T_{10} + T_{11} + T_{12} T_{13} + T_{14}$$

$$CD^{E9} = T_{00} + T_{02} + T_{03} + T_{04} + T_{10} + T_{11} + T_{12} + T_{13} + T_{14}$$

$$CD^{E10} = T_{00} + T_{01} + T_{02} + T_{03} + T_{04} + T_{10} + T_{11} + T_{12} + T_{13} + T_{14} + T_{20}$$

$$CD^{E11} = T_{00} + T_{01} + T_{02} + T_{03} + T_{04} + T_{10} + T_{11} + T_{12} + T_{13} + T_{14} + T_{21}$$

$$CD^{E12} = T_{00} + T_{01} + T_{02} + T_{03} + T_{04} + T_{10} + T_{11} + T_{12} + T_{13} + T_{14} + T_{22}$$

$$CD^{E13} = T_{00} + T_{01} + T_{02} + T_{03} + T_{04} + T_{10} + T_{11} + T_{12} + T_{13} + T_{14} + T_{23}$$

$$CD^{E14} = T_{00} + T_{01} + T_{02} + T_{03} + T_{04} + T_{10} + T_{11} + T_{12} + T_{13} + T_{14} + T_{24}$$

$$CD^{E15} = T_{00} + T_{01} + T_{02} + T_{03} + T_{04} + T_{10} + T_{11} + T_{12} + T_{13} + T_{14} + T_{30}$$

$$CD^{E16} = T_{00} + T_{01} + T_{02} + T_{03} + T_{04} + T_{10} + T_{11} + T_{12} + T_{13} + T_{14} + T_{31}$$

$$CD^{E17} = T_{00} + T_{01} + T_{02} + T_{03} + T_{04} + T_{10} + T_{11} + T_{12} + T_{13} + T_{14} + T_{32}$$

$$CD^{E18} = T_{00} + T_{01} + T_{02} + T_{03} + T_{04} + T_{10} + T_{11} + T_{12} + T_{13} + T_{14} + T_{33}$$

$$CD^{E19} = T_{00} + T_{01} + T_{02} + T_{03} + T_{04} + T_{10} + T_{11} + T_{12} + T_{13} + T_{14} + T_{34}$$

In method block 230, an error fit metric is determined for each of the evaluation models. For example, LOOCV may be used to determine the fit error metric for each of the evaluation models. In method block 240, it is determined if the fit error metric, $FE_{E(i)}$, for one of the evaluation models is less than the fit error metric of the reference model. The evaluation model identified in block 240 becomes the reference model in method block 250, and the process repeats at block 220. If none of the evaluation models has a fit error metric less than the fit error metric of the reference model in method block 240, the reference model is selected as the appropriate model to use for the photolithography system. After being selected, the reference model may be trained on the complete data set in method block 260 to determine the values for the model coefficients.

For the dose/focus model 175 to be effective, it should be able to distinguish between focus induced variation and exposure induced variation around the intended operating region. After a particular dose/focus model 175 is selected as being appropriate for modeling the photolithography tool 130 and the operation being performed, the photolithography solver 170 determines if the dose/focus model 175 is capable of differentiating a small change in dose from a small change in focus around the intended operating region.

The following illustration deals with the quantification of feasibility to deconvolute focus-exposure effects using top and bottom CD data. For this purpose, a model correlation matrix is derived based on following basics.

Consider following set of linear equations $$c_1 = a_1 x + b_1 y$$

$$c_2 = a_2 x + b_2 y.$$

(2)

For Equation 1 (with a, b and c as constants), slopes can be determined as follows:

$$m_1 = \frac{dy}{dx} = -\frac{a_1}{b_1} \quad (3)$$

$$m_2 = \frac{dy}{dx} = -\frac{a_2}{b_2}.$$

An angle θ between two lines with slopes $m_1$ and $m_2$ can be determined using:

$$\tan\theta = \frac{m_1 - m_2}{1 + m_1 m_2} \quad (4)$$

From Equation 4, the following observations may be made:
1. The two lines are parallel when $m_1 = m_2$; (lines meet at infinity, no unique solution exists)
2. The two lines are perpendicular when $m_1 m_2 = -1$; (intersection of two lines is least sensitive to two slopes in this case)
3. For any other condition, the angle between the two lines lies between 0° and 90°.

A small change in top and bottom CD can be written as:

$$dCD_{top} = \frac{\partial CD_{top}}{\partial F} dF + \frac{\partial CD_{top}}{\partial E} dE \quad (5)$$

$$dCD_{bot} = \frac{\partial CD_{bot}}{\partial F} dF + \frac{\partial CD_{bot}}{\partial E} dE.$$

Similar to Equation 1, slopes for Equation 5 can be defined as $$m_1 = -\left(\frac{\partial CD_{top}/\partial F}{\partial CD_{top}/\partial E}\right) \quad (6)$$

$$m_2 = -\left(\frac{\partial CD_{bot}/\partial F}{\partial CD_{bot}/\partial E}\right).$$

The angle θ would be given as $$\tan\theta = \left|\frac{\left(\frac{\partial CD_{top}/\partial F}{\partial CD_{top}/\partial E}\right) - \left(\frac{\partial CD_{bot}/\partial F}{\partial CD_{bot}/\partial E}\right)}{1 + \left(\frac{\partial CD_{top}/\partial F}{\partial CD_{top}/\partial E}\right) \cdot \left(\frac{\partial CD_{bot}/\partial F}{\partial CD_{bot}/\partial E}\right)}\right|. \quad (7)$$

If a correlation number is defined as $$1 - \frac{2\theta}{\pi},$$

$$C.N. = 1 - \frac{2\theta}{\pi}$$

$$= 1 - \frac{2}{\pi}\tan^{-1}\left(\left|\frac{\left(\frac{\partial CD_{top}/\partial F}{\partial CD_{top}/\partial E}\right) - \left(\frac{\partial CD_{bot}/\partial F}{\partial CD_{bot}/\partial E}\right)}{1 + \left(\frac{\partial CD_{top}/\partial F}{\partial CD_{top}/\partial E}\right) \cdot \left(\frac{\partial CD_{bot}/\partial F}{\partial CD_{bot}/\partial E}\right)}\right|\right).$$

As above, a unique solution exists only if θ≠0° or C.N.≠1 or $$\frac{\left(\frac{\partial CD_{top}/\partial F}{\partial CD_{bot}/\partial F}\right)}{\left(\frac{\partial CD_{top}/\partial E}{\partial CD_{bot}/\partial E}\right)} \neq 1. \quad (8)$$

In words, the relative response of top and bottom CD to focus should be different from the relative response to exposure to deconvolute focus and exposure effects.

A best case may be defined when θ=90° or C.N.=0 or $$\left(\frac{\partial CD_{top}/\partial F}{\partial CD_{top}/\partial E}\right) \cdot \left(\frac{\partial CD_{bot}/\partial F}{\partial CD_{bot}/\partial E}\right) = -1. \quad (9)$$

For any other intermediate case, 0°<θ<90° or 1>C.N.>0.

To determine actual numbers for the correlation number, the partial derivatives of the dose and focus equations in the dose/focus model 175 may be evaluated at the expected operating point (i.e., the parameters specified in the operating recipe. In practice, the correlation number has shown a tendency to range from 0.85 to 0.95, even for models that appear to have significantly different responses to dose and focus. The particular cutoff point that is used as a threshold for determining if the dose/focus model 175 can adequately discriminate between dose and focus variation may vary depending on the particular implementation. The threshold may also vary depending on the intended use for the dose/focus model 175 (e.g., tool qualification, trending, or process control).

The dose/focus model 175 expresses top and bottom CD as a function of dose and focus. However, in use the model is used to extract received dose and focus parameters from measured top and bottom CD. Hence, a model inversion is required. Generally, the dose/focus model 175 provides a system of two equations in two unknowns that may be solved for unique dose and focus values. Hence, when $CD_{top}$ and $CD_{bottom}$ values are measured for a current wafer, the dose/focus model 175 may be inverted to solve for the dose and focus actually seen by the wafer, as compared to the expected dose and focus parameters specified in the operating recipe. A comparison between the expected dose and focus and the analytically determined dose and focus may be used to validate the operation of the photolithography tool 130, monitor the photolithography process over time, or control the operating recipe to attempt to reduce the error between the expected and determined values. These specific uses for the dose/focus model 175 are described in greater detail below.

As the complexity of the dose/focus model 175 may vary significantly, a generic model inversion solution is not available. In the illustrated embodiment, the photolithography solver 170 employs a numerical solver to find the roots of the focus and dose equations as a function of the measured top and bottom CD. The numerical technique implemented by the photolithography solver 170 seeks to minimize the sum of the squared errors according to the following expression, where Error is simply the difference between the actual and the model-predicted CD value:

$$\min_{BotCD, TopCD} J = Error_{BotCD}^2 + Error_{TopCD}^2 \qquad (10)$$

It has been determined that a numerical solver is able to match the performance of an analytical root-finding method for the case where there are real roots and exceed it where all the roots are complex. Hence, in the illustrated embodiment, the photolithography solver 170 employs the numerical method for model inversions, as defined by Equation 10. The commanded dose and focus values are used to seed the inversion, and a steepest-descent methodology is used to minimize the potential for erroneous local minima. The numerical method allows the form of the models to be optimized based on the real character of the response (including orders higher than two), but adds calculation overhead and potential convergence and local minima issues.

To provide ease of use in a real time manufacturing environment, the photolithography solver 170 employs a library method for inversion. The library method involves an additional step after model optimization to create a dose/focus library 178 (see FIG. 1) of top and bottom CD solutions for the full range of modeled dose and focus values. The calculation overhead is thereby accrued one time during modeling rather than at every inversion event. During inversion, a nearly instantaneous match can be found in the solution library 178.

In generating the dose/focus library 178, the photolithography solver 170 receives user input regarding the size of the library grid, which represents the total number of dose and focus steps that will be used to produce the library of top and bottom CD values. For example, a grid having 500 focus points×500 dose points may be specified to cover the expected operating region. Dose and focus values are converted to top and bottom CD values by simple model insertion. For example, the photolithography solver 170 employs a numerical solver using Equation 10 to determine top and bottom CD values for each dose and focus coordinate.

After generating the CD data, the photolithography solver 170 filters duplicate CD data. Duplicate library CD data (or close within machine precision) is detected and, If found, removed from the library dose/focus library 178 (i.e., only one set is retained) and stored in a supplemental library. The photolithography monitor 160 provides measured top and bottom CD measurements to the photolithography solver 170, and the photolithography solver 170 uses the results stored in the dose/focus library 178 to return corresponding dose and focus values. Along with the top and bottom CD values, the photolithography monitor 160 may also provide the commanded dose and focus parameters to the photolithography solver 170.

Although the dose and focus parameters are specified in a rectangular grid, the resulting CD data does not follow a grid distribution, due to the non-linearity of the dose/focus model 175. The resulting CD data takes the form of a scatter plot. In use, the measured top and bottom CD data will not likely land on an exact data point in the dose/focus library 178.

In the illustrated embodiment, the photolithography solver 170 employs a triangulation technique to match top and bottom CD measurements taken by the metrology tool 150 to entries in the dose/focus library 178 to extract dose and focus data. The triangulation approach is implemented using Delaunay Tessellation methodology. Mathematical routines for performing the triangulation may be found in commercial software applications, such as MATLAB®, offered commercially by The MathWorks, Inc. of Natick, Mass. Delaunay Tesselation defines a set of simplices with the property that, for each simplex, the unique sphere circumscribed about the simplex contains no data points. In two-dimensional space, a simplex is a triangle. The "delaunayn" function in MATLAB® returns the indices of the points in a data set that comprise the simplices of an n-dimensional Delaunay tessellation of the data set.

To invert a new measurement, the photolithography solver 170 employs a nearest triangle search to match the two dimensional top and bottom CD data to the appropriate triangle defined by the Delauney Tesselation. Once the nearest triangle is selected, the photolithography solver 170 examines the dose and focus values corresponding to each vertex of the triangle and chooses as a solution the one that is closest to the commanded dose and focus. While it may intuitively seem more accurate to interpolate between the vertex solutions, a condition may exist where vertices on the same triangle have corresponding dose and focus values that are dissimilar. In such a case, the interpolation method would produce an answer that is in between the disparate dose and focus values. This would be analogous to averaging the local minima from a numerical inversion. The numerical routine used by the photolithography solver 170 biases the optimization towards the commanded values. The library method does the same.

After identifying the nearest triangle, the photolithography solver 170 accesses the duplicate CD matrix to determine if any of the three triangle vertices have duplicates that were stored during the CD filtering step described above. The corresponding dose and focus values for the duplicate results in the supplementary library are also considered during nearest vertex solution finding. This approach considers all possible dose and focus values that produce CDs in near proximity to the sample when choosing a solution.

The photolithography solver 170 implements two checks to handle CD data that falls outside the modeled range of solutions. First, a convex hull is drawn about the two dimensional distribution of top and bottom CD data produced by the range of modeled dose and focus. A convex hull is simply the minimal convex polygon that contains all points in a data set. Imagine an elastic band stretched open to encompass a grouping of rigidly fixed data points. When released, the band will assume the shape of the required convex hull. The photolithography solver 170 tags all data points outside the library convex hull for numerical inversion.

There are times, however, when the actual library range does not assume convex boundaries. When the nearest triangle search is completed, points that are within the convex hull but actually outside the model range will have at least one triangle side that is significantly long. The photolithography solver 170 employs a maximum allowable triangle vector based on CD range that will trigger a numerical inversion in the same way as a convex hull failure.

While choosing the correct model order is an important factor in achieving good results, in many ways the lithography process itself dictates the limits of success. In control theory, observability is a measure for how well internal states of a system can be inferred by knowledge of its external outputs. In this case, small changes in dose and focus should be able to be observed as independent changes in the response of one or both of the modeled CD parameters. This is generally a simple requirement for dose, but a complex requirement for focus. Even if the model fits are near unity, the photolithography solver 170 will find a wide range of nearly equivalent inversion results if the Bossung plots are flat in their response to focus. A test vehicle can be engineered for good focus observability if the objective is to calibrate or characterize the photolithography tool 130. But if the objective is to work within the bounds of existing infrastructure for production layers, it is likely (and favorable for manufacturing) that one or both of the CD parameters will lack focus response in some portion of the process window.

A technique for checking for dose and/or focus observability is to employ the model 175 to perform an inversion routine around the expected operating region that factors in expected CD noise and generates a resolution metric for dose and/or focus based on the noise. To determine the sensitivity, the expected operating region in terms of dose and focus, and the expected noise present in the top and bottom CD measurements is specified by a user. For example, the user may specify the commanded dose and focus and a one-sigma noise estimate for the CD measurements. The amount of noise may depend on factors such as the type of metrology tool 150 used. The photolithography solver 170 first employs the dose/focus model 175 in the forward direction to generate an expected top and bottom CD. Then, the photolithography solver 170 constructs a CD distribution including randomly generated pairs of top and bottom CD using the noise estimate and an assumed normal distribution. The photolithography solver 170 then uses the dose/focus library 178 to invert each of the pairs in the CD distribution to generate a dose distribution and a focus distribution, each having a mean that corresponds to the respective commanded dose and focus and a standard deviation that defines the minimum observable dose or focus resolution achievable in the operating region given the noise characteristics. The dose and focus sensitivity metrics indicate the sensitivity of the process to dose and/or focus in the operating region. The dose and focus sensitivity metrics may be used in combination with the deconvoluting correlation metric described above to determine the suitability of the model for characterizing the process at the expected operating point.

The photolithography monitor 160 may perform various monitoring activities using the dose and focus information provided by the photolithography solver 170. Exemplary uses for the photolithography modeling information include calibration and characterization of the photolithography tool 130, product monitoring, and automated process control.

With respect to calibration and characterization, one lithography equipment metric that is regularly calibrated is the scanned image tilt. Tilt refers to the angle that the best-focus image plane forms relative to the wafer surface. If the scanned image is tilted top-to-bottom or left-to-right, the problem will be manifested as variation in effective focus values across the image field. It is a common practice to regularly measure features in the corners of the field to monitor for tilt issues. Historically it has been difficult to translate those corner CD measurements into actual focus values for tilt calibration, but by using the dose/focus model 175 to invert top and bottom CD measurements, the reticle tilt can be readily measured in the X and Y directions.

To measure the image tilt, dose/focus model 175 is used to invert top and bottom CD values for each corner of the reticle field and every field on the wafer. The average effective focus value from each corner location may then be used to calculate the degree of tilt along the length of the scanner slit. The left-to-right focus bias is converted to radians of tilt using the equation:

$$\text{Tilt} = \arctan((F_2 - F_1)/x), \tag{11}$$

where $F_1$ and $F_2$ are focus measurements at two points, and x is the distance between the two points.

When attempting to characterize the performance baseline of the photolithography tool 130, it is useful to measure any systematic non-uniformity in dose and focus across the wafer surface. The two dominant modes of systematic non-uniformity are across the image field and across the wafer. Uniformity maps may be created by measuring multiple points in the field and all fields on the wafer, then inverting the data and plotting the results on a contour map. These maps can be used to identify systematic chuck flatness issues, edge effects, reticle shape, and a variety of other potential problems.

To check across-wafer and intra-field performance of the scanner, the metrology tool 150 may measure around 16 points/field for the complete wafer. Both horizontal and vertical scatterometry gratings may be employed. Bottom and top CD data can be inverted to produce dose and focus values for each measurement location. CD variance comes from a variety of sources in addition to dose and focus, such as reticle write errors, FEM model mismatch, process and metrology noise, etc. To determine actual dose and focus variation, it is useful to measure and remove systematic sources of CD variation that are not related to dose and focus errors. In one such example, reticle effects should be de-convoluted to achieve an accurate analysis of scanner performance. One method for removing reticle effects is to directly measure the reticle and normalize the CD data for the reticle signature prior to modeling and inversion. In the absence of such reticle CD measurements, it is reasonable to assume that the average across-field variance in each CD parameter is due primarily to the reticle. This variance may be excluded in the results allowing other variance to be identified, such as wafer edge effects. Intra-field focus and astigmatism variations may also be identified. Astigmatism values may be approximated by analyzing the distribution of focus offsets between vertical and horizontal measurements.

In one embodiment, the photolithography monitor 160 operates in a fault detection mode. The photolithography monitor 160 compares the measured dose and focus to the commanded dose and focus to identify abnormal conditions. If the magnitude of the difference between the measured focus and/or dose the commanded value for the parameter exceeds a fault threshold (e.g., static or dynamic threshold), the photolithography monitor 160 may indicate an alert or fault condition for the photolithography tool 130.

The dose/focus observations may be conducted using different sampling plans that specify different measurement site groupings depending on the particular use. Across wafer or across-field variation may be monitored using statistical process control techniques, such as control charts.

Following a photolithography fault message, production of the associated wafers may be suspended until further corrective actions may be completed. For example, the dose/focus model 175 may be re-verified using updated metrology data. If the nature of the dose/focus variation is such that an increased likelihood of faulty or poor-performing devices is present, the associated wafers may be reprocessed after performance of a preventative maintenance procedure (e.g., calibration) on the photolithography tool 130.

In another embodiment, the photolithography monitor 160 may also function as a controller that determines one or more operating recipe parameters of the photolithography tool 130 to attempt to reduce variation in the dose and or focus parameters seen at the measured sites. To that end, the photolithography monitor 160 may employ a photolithography control model 180 that adjusts photolithography parameters, such as dose, focus, illumination type, sigma, numerical aperture, etc., based on the measured dose and/or focus parameters. The photolithography control model 180 may be developed empirically using commonly known linear or non-linear techniques. The photolithography control model 180 may be a relatively simple equation based model (e.g., linear, exponential, weighted average, etc.) or a more complex model, such as a neural network model, principal component analysis (PCA) model, or a projection to latent structures (PLS) model. The specific implementation of the model 180 may vary depending on the modeling technique selected.

By modeling dose and/or focus performance and using the photolithography control model 180 to adjust the operating recipe, the photolithography monitor 160 may react to minor disturbances in the actual dose and/or focus as compared to the commanded values. The top and bottom CD metrology data may be used for fault detection, as described above, as well as for process control. In the process control technique, the photolithography monitor 160 receives top and bottom CD metrology data and uses the difference between the extracted dose and focus and the commanded dose and focus to generate an error signal. One or more operating recipe parameters of the photolithography tool 130 may be adjusted based on the error signal to attempt to reduce variation between the actual and commanded dose and focus parameters.

In another technique, a snapshot of the photolithography process may be taken at predetermined intervals as opposed to continuously. For example, a photolithography analysis may be completed once per shift, once per day, etc. The frequency of the analysis may vary depending on the available metrology capacity and the sensitivity of the photolithography variation.

Figure 3:
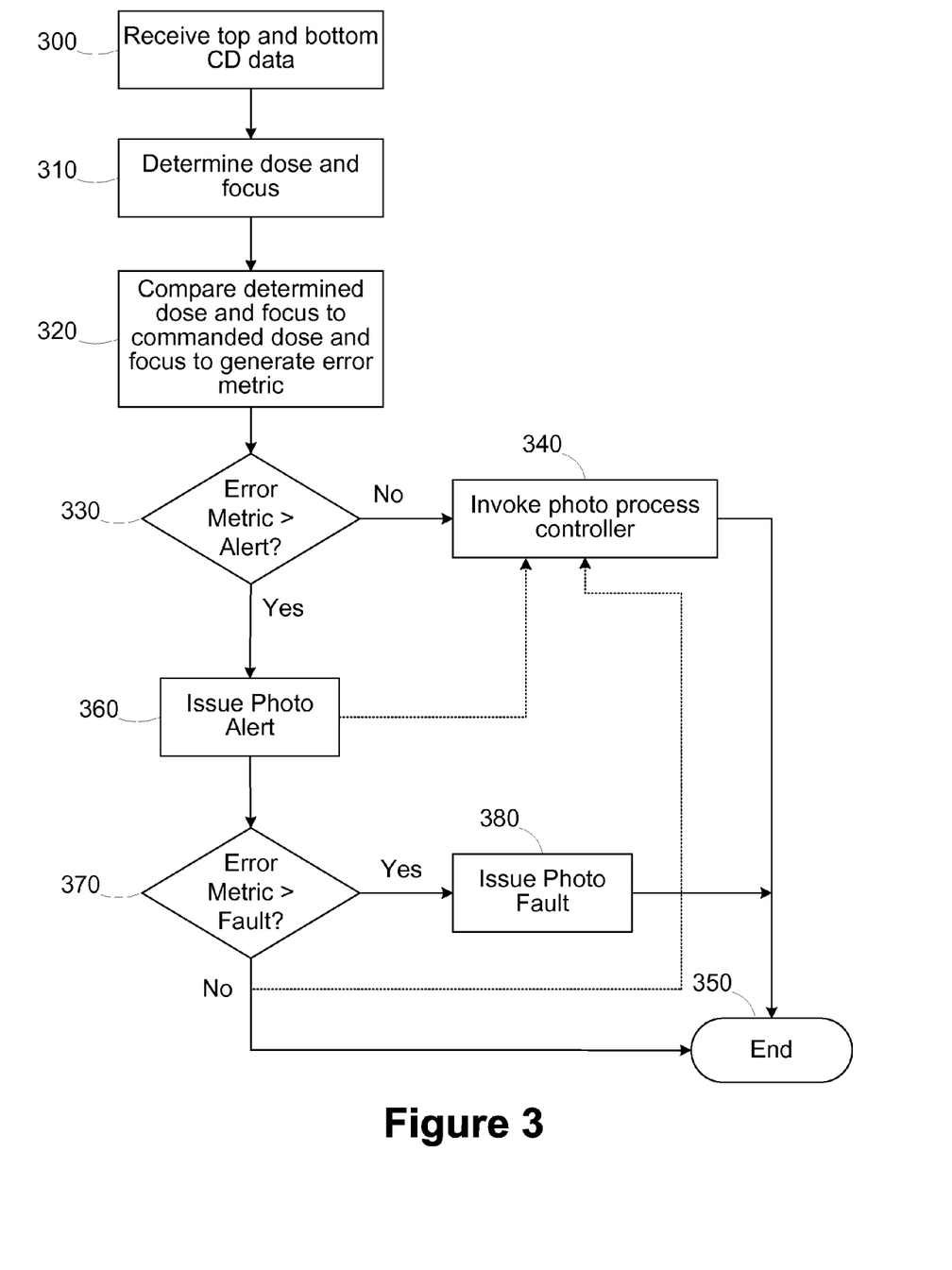
FIG. 3 is a simplified flow diagram of a method for monitoring the performance of an photolithography system in accordance with yet another illustrative embodiment.

FIG. 3 illustrates a simplified flow diagram for an integrated photolithography fault detection and process control technique. In method block 300, top and bottom CD metrology data are received. In method block 310, the focus and dose associated with the top and bottom CD measurements are determined using the dose/focus library 178 or dose/focus model 175, as described above. In method block 320, the determined dose and focus are compared to the commanded dose and focus to generate an error metric. The error metric may include a dose error term and a separate focus error term. Hence, the term error metric is intended to cover one or more error terms. If the error metric does not exceed an alert threshold in method block 330, the photolithography controller functionality of the photolithography monitor 160 is invoked to attempt to reduce the variation in method block 340, and the method terminates in method block 350.

If the error metric exceeds the alert threshold in method block 330, a photolithography alert is issued in method block 360. After the issuance of the photolithography alert, the method may terminate in method block 350, or alternatively (i.e., as indicated in phantom), the photolithography process controller may be invoked in method block 340. An existing photolithography alert may be terminated manually by a process engineer or operator or automatically after a previous alert clears in method block 330.

The photolithography metric is compared to a fault threshold in method block 370. If no fault is present, the method terminates in method block 350 or the photolithography process controller is invoked in method block 340. If a photolithography fault is identified in method block 370, a photolithography fault is issued in method block 380 and the method terminates in method block 350. The photolithography controller is not typically invoked after the identification of a fault condition as more intensive investigation and corrective action is generally required.

Monitoring the efficacy of the photolithography system by determining actual dose and focus parameters has numerous advantages. The photolithography tool 130 may be qualified and calibrated. Adverse trends in product characteristics or tool performance may be identified. Process control techniques may be used to reduce variation, thereby increasing system performance and profitability.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
    defining a reference model of a system for modeling data associated with the system, the reference model having a plurality of terms;
    generating a reference fit error metric for the reference model;
    generating a set of evaluation models each having one term different than the reference model;
    generating an evaluation fit error metric for each of the evaluation models;
    replacing the reference model with a selected evaluation model responsive to the selected evaluation model having an evaluation fit error metric less than the reference fit error metric;
    repeating, based on the replaced reference model, the generating of the reference fit error metric, the generating of the set of evaluation models, the generating of the evaluation fit error metrics, and the replacing of the reference model until no evaluation model has an evaluation fit error metric less than the reference fit error metric;
    training the reference model in which no evaluation model has a smaller evaluation fit metric by using the data associated with the system; and
    employing the trained reference model to determine at least one characteristic of the system.

2. The method of claim 1, wherein the trained reference model includes an input term and is operable to generate an output term as a function of the input term, and the method further comprises:
    measuring at least one value of the output term;
    inverting the trained reference model to determine a value of the input term that generates the value of the output term; and
    comparing the determined value of an input term to a commanded value of the input term associated with the system.

3. The method of claim 2, further comprising validating operability of a tool in the system based on the comparison.

4. The method of claim 2, further comprising controlling the system based on the comparison.

5. The method of claim 2, further comprising identifying a fault condition associated with the system based on the comparison.

6. The method of claim 1, wherein generating the set of evaluation models comprises generating a subset of the evaluation models by removing selected terms in the reference model, each removal generating one of the evaluation models.

7. The method of claim 1, wherein the terms of the reference model are selected from a set of potential terms, and generating the set of evaluation models comprises generating at least one evaluation model for each of the terms in the set of potential terms not selected for the reference model.

8. The method of claim 1, wherein generating the reference fit error metric and the evaluation fit error metrics comprises performing a leave-one-out cross validation to generate each of the fit error metrics.

9. The method of claim 1, wherein a first subset of the evaluation models has one less term than the reference model, and a second subset of the evaluation models has one more term than the reference model.

10. A method for monitoring a photolithography system, comprising:
  defining a reference model of the photolithography system for modeling top and bottom critical dimension data associated with features formed by the photolithography system as a function of dose and focus, the reference model having a plurality of terms;
  generating a reference fit error metric for the reference model;
  generating a set of evaluation models each having one term different than the reference model;
  generating an evaluation fit error metric for each of the evaluation models;
  replacing the reference model with a selected evaluation model responsive to the selected evaluation model having an evaluation fit error metric less than the reference fit error metric;
  repeating, based on the replaced reference model, the generating of the reference fit error metric, the generating of the set of evaluation models, the generating of the evaluation fit error metrics, and the replacing of the reference model until no evaluation model has an evaluation fit error metric less than the reference fit error metric;
  training the reference model for which no evaluation model has an evaluation fit error metric less than the reference fit error metric using the top and bottom critical dimension data;
  receiving a top critical dimension measurement and a bottom critical dimension measurement of a feature formed by the photolithography system using a commanded dose parameter and a commanded focus parameter;
  employing the trained reference model using the top and bottom critical dimension measurements to determine values for a received dose parameter and a received focus parameter; and
  comparing the received dose and focus parameters to the commanded dose and focus parameters to characterize the photolithography system.

11. The method of claim 10, further comprising controlling an operating recipe of a photolithography tool in the photolithography system based on the comparison.

12. The method of claim 10, further comprising validating operability of a photolithography tool in the system based on the comparison.

13. The method of claim 10, further comprising identifying a fault condition associated with the system based on the comparison.

14. The method of claim 10, wherein generating the set of evaluation models comprises generating a subset of the evaluation models by removing selected terms in the reference model, each removal generating one of the evaluation models.

15. The method of claim 10, wherein the terms of the reference model are selected from a set of potential terms, and generating the set of evaluation models comprises generating at least one evaluation model for each of the terms in the set of potential terms not selected for the reference model.

16. The method of claim 10, wherein generating the reference fit error metric and the evaluation fit error metrics comprises performing a leave-one-out cross validation to generate each of the fit error metrics.

17. The method of claim 10, further comprising determining a correlation metric for the trained reference model at an expected operating dose and focus point for the photolithography system.

18. The method of claim 17, wherein the trained reference model comprises a top critical dimension model and a bottom critical dimension model, and determining the correlation metric further comprises:
  determining a first partial derivative of the top critical dimension model at the expected operating dose and focus point with respect to dose;
  determining a second partial derivative of the top critical dimension model at the expected operating dose and focus point with respect to focus;
  determining a third partial derivative of the bottom critical dimension model at the expected operating dose and focus point with respect to dose;
  determining a fourth partial derivative of the bottom critical dimension model at the expected operating dose and focus point with respect to focus; and
  generating the correlation metric based on the first, second, third, and fourth partial derivatives.

19. The method of claim 10, further comprising determining a sensitivity metric defining a minimum dose and focus resolution of the photolithography system at the commanded dose and focus parameters.

20. The method of claim 19, wherein determining the sensitivity metric further comprises:
  generating expected top and bottom critical dimension values given the commanded dose and focus parameters using the trained reference model;
  generating a critical dimension distribution based on the expected top and bottom critical dimension values and a noise estimate;
  inverting the trained reference model for each point in the critical dimension distribution to generate a focus distribution and a dose distribution;
  determining a focus sensitivity metric based on a standard deviation of the focus distribution; and
  determining a dose sensitivity metric based on a standard deviation of the dose distribution.

21. The method of claim 10, wherein a first subset of the evaluation models has one less term than the reference model, and a second subset of the evaluation models has one more term than the reference model.

22. A system, comprising:
  a photolithography tool operable to generate a feature on a wafer using a commanded dose parameter and a commanded focus parameter;
  a metrology tool operable to measure a top critical dimension of the feature and a bottom critical dimension of the feature;
  a photolithography solver operable to define a reference model of the photolithography tool for modeling top and bottom critical dimension data associated with features formed by the photolithography tool as a function of dose and focus, the reference model having a plurality of terms, the photolithography solver being further operable to generate a reference fit error metric for the reference model, generate a set of evaluation models each having one term different than the reference model, generate an evaluation fit error metric for each of the evaluation models, replace the reference model with a selected evaluation model responsive to the selected evaluation model having an evaluation fit error metric less than the reference fit error metric, repeat, based on the replaced reference model, the generating of the reference fit error metric, the generating of the set of evaluation models, the generating of the evaluation fit error metrics, and the replacing of the reference model until no evaluation model has an evaluation fit error metric less than the reference fit error metric, and train the reference model for which no evaluation model has an evaluation fit error metric less than the reference fit error metric by using the top and bottom critical dimension data; and a photolithography monitor operable to receive the top critical dimension measurement and the bottom critical dimension measurement, employ the trained reference model using the top and bottom critical dimension measurements to determine values for a received dose parameter and a received focus parameter, and compare the received dose and focus parameters to the commanded dose and focus parameters to characterize the photolithography system.

23. The system of claim 22, wherein a first subset of the evaluation models has one less term than the reference model, and a second subset of the evaluation models has one more term than the reference model.

* * * * *